United States Patent [19]

Sugiyama et al.

[11] Patent Number: 4,637,118
[45] Date of Patent: Jan. 20, 1987

[54] MACHINE TOOL FOR DRILLING PRINTED CIRCUIT BOARDS

[75] Inventors: Kiyoshi Sugiyama, Susono; Tomio Furuhashi, Numazu, both of Japan

[73] Assignee: Toshiba Kikai Kabushiki Kaisha, Tokyo, Japan

[21] Appl. No.: 831,614

[22] Filed: Feb. 21, 1986

[30] Foreign Application Priority Data

Feb. 25, 1985 [JP] Japan .................................. 60-36148

[51] Int. Cl.$^4$ ............................................. B23Q 7/06
[52] U.S. Cl. ...................................... 29/563; 414/222; 414/750
[58] Field of Search ............ 29/563, 568, 33 P, 33 Q, 29/26 R, 51; 409/219, 235, 236, 237, 183, 159, 164; 408/70, 31, 34; 414/750, 222, 19, 753

[56] References Cited

U.S. PATENT DOCUMENTS

| | | | |
|---|---|---|---|
| 3,090,261 | 5/1963 | Hill | 408/70 |
| 3,280,659 | 10/1966 | Allen | 408/70 X |
| 3,372,609 | 3/1968 | Windgne | 408/70 X |
| 3,552,264 | 1/1971 | Meinke | 409/212 |
| 3,581,623 | 6/1971 | Galbarini | 409/237 |
| 3,895,477 | 7/1975 | Yamashita | 414/750 X |
| 3,918,825 | 11/1975 | Alberl | 29/563 X |
| 3,982,845 | 9/1976 | Dockery et al. | 408/70 X |
| 4,403,391 | 9/1983 | Peacock | 29/568 |

FOREIGN PATENT DOCUMENTS

| | | | |
|---|---|---|---|
| 2635054 | 2/1978 | Fed. Rep. of Germany | 408/70 |
| 8007 | 1/1982 | Japan | 408/31 |
| 156644 | 5/1984 | Japan | 29/33 P |

*Primary Examiner*—William R. Briggs
*Attorney, Agent, or Firm*—Stevens, Davis, Miller & Mosher

[57] ABSTRACT

A machine well suited for the creation holes in printed circuit boards (PCBs). A work supply magazine containing a stack of PCBs to be drilled is disposed on one side of the machine, and a work recovery magazine for receiving the drilled PCBs is disposed on the other side, with a table mounted therebetween, preferably for displacement in one horizontal direction. One or more saddles, each carrying one or more toolheads and driven by a common saddle motor, are disposed over the table for reciprocating movement in a direction at right angles with the direction of table displacement. Also disposed over the table and reciprocably movable in the same direction as the saddles is a carriage carrying a set of work transfer fingers movable up and down into and out of work transfer engagement with the PCBs in the work supply magazine and on the table. The saddles and the carriage can be connected and disconnected as required. When connected to the saddles, the carriage is driven by the saddle motor to enable the work transfer fingers to transfer the successive PCBs from the supply magazine to the table and then, upon completion of the drilling, to the recovery magazine.

15 Claims, 9 Drawing Figures

MACHINE TOOL FOR DRILLING PRINTED CIRCUIT BOARDS

BACKGROUND OF THE INVENTION

Our invention relates to machine tools in general and, in particular, to those for creating holes in, or otherwise working on, generally flat work, with provisions for the loading and unloading of the work. The machine of our invention has particular utility in conjunction with the creation of holes in preassigned positions in printed circuit boards (PCBs), although we do not wish our invention to be unnecessarily limited to this particular application.

A variety of PCB drilling machines have been suggested and used in the electronics industry. Generally, such machines comprise a motor driven toolhead disposed above a table, and work transfer means for loading and unloading successive PCBs on and from the table. Perhaps typical of such machines is the one disclosed in Japanese Laid Open Patent Application No. 59-156644. This prior art apparatus has a work loading and unloading mechanism disposed between the drilling machine proper and a work storage station disposed forwardly of the machine.

We object to this known configuration because of the large installation space demanded by the complete apparatus. As an additional disadvantage, the noted loading and unloading mechanism constitutes an entity nearly independent of the drilling machine proper, adding substantially to the total number of the constituent parts. Controlling the operation of the apparatus including the loading and unloading mechanism is also not so easy as can be desired. Still further, since the work is reciprocated between the table and the remote storage station, the prior art apparatus requires a considerable length of time for work loading and unloading.

SUMMARY OF THE INVENTION

We have hereby invented apparatus of the character defined which has a significantly less installation space requirement, and which affords higher production through reduction of work loading and unloading time, than heretofore.

Stated generally, our invention provides a machine tool for working on PCBs or like substantially flat workpieces, comprising a work supply magazine and a work recovery magazine mounted to opposite sides of frame means. The work supply magazine is for holding a stack of workpieces to be worked upon, and the work recovery magazine for receiving the workpieces after they have been worked upon. A table on which the workpieces are worked upon is disposed intermediate the supply and recovery magazines. Disposed over the table are toolhead means for working on the workpieces, which means are carried by saddle means driven by saddle drive means for linear travel relative to the table along a predetermined path extending between the supply and recovery magazines. A carriage is also disposed over the table for travel relative to the same in a direction parallel to the predetermined path of the saddle means. This carriage has mounted thereto work transfer means capable of vertical displacement into and out of work transfer engagement with the workpieces in the supply magazine and on the table. Also included are drive coupling means for connecting and disconnecting the saddle means and the carriage. When connected to the saddle means, the carriage is driven by the saddle drive means for enabling the work transfer means to transfer the successive workpieces from the work supply magazine to the table and thence, upon completion of the required working on the workpieces by the toolhead means, to the work recovery magazine. Upon disconnection of the saddle means and the carriage, on the other hand, the toolhead means can work on the workpieces on the table by being driven by the saddle drive means independently of the carriage and the work transfer means.

Preferably, the apparatus is further equipped with supply magazine drive means for lifting the supply magazine a predetermined unit distance each time a workpiece is carried away therefrom by the work transfer means, and with recovery magazine drive means for lowering the recovery magazine a similar unit distance each time one finished workpiece is transferred thereto by the work transfer means.

It will now be apparent that the successive workpieces are transferred on one horizontal plane and in one direction from the supply magazine to the table and thence, upon completion of any desired machining, to the recovery magazine. With the supply and recovery magazines thus integrally incorporated with the machining section, the complete apparatus makes a much less installation space requirement than the prior art.

Both supply and recovery magazines can be made readily detachable from the machine, as in a preferred embodiment disclosed herein. The supply magazine may therefore be loaded with a stack of workpieces to be machined, and the recovery magazine may be emptied of the machined workpieces, at different locations. In other words, all that is required preparatory to the commencement of machining is to mount a loaded supply magazine and an empty recovery magazine in their preassigned positions on both sides of the table.

As will also be understood from the foregoing summary, the loading and unloading of the successive workpieces onto and from the table can be concurrent with the machining of the loaded workpieces. This concurrence, combined with the noted short makeready time, contributes to the higher production of the machine.

Our invention also features the connection and disconnection, by the drive coupling means, of the saddle means, carrying the toolhead means, and the carriage carrying the work transfer means. We have thus made it possible for the saddle drive means to drive not only the toolhead means, for machining, but also the work transfer means. Requiring no drive means of its own, the work transfer means is materially simplified in construction, and so is the complete apparatus.

According to an additional feature of our invention, the table is provided with retractable work lift means for holding the work slightly above the table surface during its transfer. The table surface is therefore not to be scratched or otherwise marred by the work, nor is the work transfer to be affected by the chips that may lie on the table from the previous machining.

It is also to be appreciated that the apparatus of our invention lends itself to ready automation. For the automatic operation of the apparatus we suggest that the supply magazine be furnished with an optically readable mark identifying the particular work contained therein. The apparatus may be equipped to read this mark as the magazine is mounted in place, and to control the work transfer and machining operations accordingly.

The above and other features and advantages of our invention and the manner of realizing them will become more apparent, and the invention itself will best be understood from a study of the following description and appended claims, with reference had to the attached drawings showing a preferable embodiment of our invention.

DESCRIPTION OF THE PREFERRED EMBODIMENT

GENERAL

We will now describe our invention in more specific aspects thereof as adapted for the creation of holes in PCBs. Generally designated 10 in FIGS. 1 and 2, the PCB drilling machine embodying our invention comprises a framework 12 having a work supply magazine 14 and a work recovery magazine 14' disposed on its opposite sides. The supply magazine 14 is provided with a magazine drive mechansim 16 for upward displacement by small increments. The recovery magazine 14' is provided with a similar drive mechanism 16' for incremental downward displacement. A table 18, on which PCBs W are to be drilled, is mounted to the framework 12 and disposed intermediate the supply and recovery magazines 14 and 14'. This table is mounted on several guide rails 20 extending horizontally in the front to rear depth direction of the machine 10, for reciprocating movement in the direction of the double headed arrow X in FIG. 2.

Figure 2:
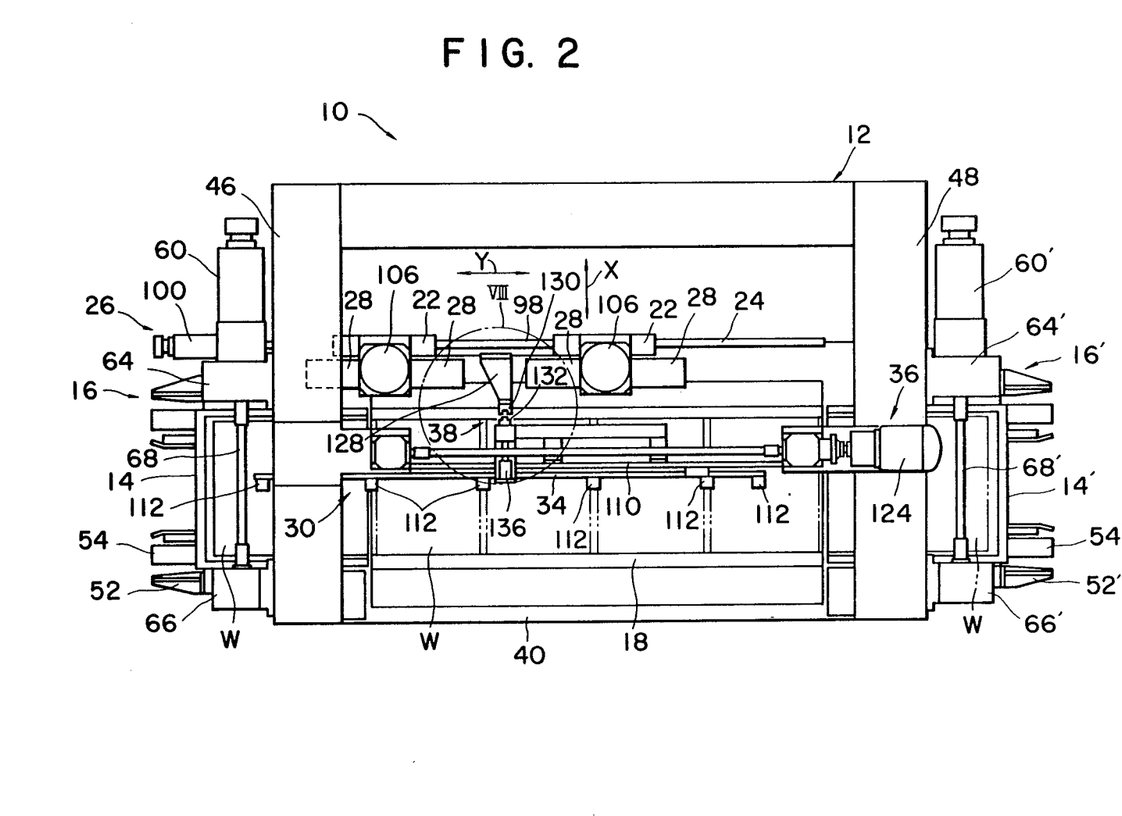
FIG. 2 is a top plan of the PCB drilling machine of FIG. 1.

FIG. 2 also reveals that one or more, two in this particular embodiment, interconnected saddles 22 are mounted on a crossrail 24 extending at right angles with the table rails 20, that is, in a direction extending between the supply and recovery magazines 14 and 14'. Driven by a saddle drive mechanism 26, the saddles 22 are reciprocably movable in the direction of the double headed arrow Y. Each saddle 22 carries a pair of toolhead assemblies 28 which are disposed over the table 18 for drilling the PCBs W thereon.

Also disposed over the table 18 is a work transfer mechanism 30 comprising a series of work transfer fingers 32 mounted to a common carriage 34 for vertical displacement into and out of work transfer engagement with the PCBs W. The carriage 34 is reciprocably movable in the direction of the arrow Y for transporting the work transfer fingers 32. The work transfer mechanism 30 is provided with a retract mechanism 36 for vertical displacement relative to the framework 12, as indicated by the double headed arrow Z in FIG. 1.

At 38 in FIG. 2 is shown a drive coupling mechanism for connecting and disconnecting the saddles 22 and the carriage 34. When connected to the saddles 22, the carriage 34 can be driven in the required direction Y by the saddle drive mechanism 26 to enable the work transfer fingers 32 to transfer the PCBs W through the apparatus 10.

We will discuss in more detail hereafter the above noted framework 12, supply and recovery magazines 14 and 14' with their drive mechanisms 16 and 16', table 18, saddles 22 with their drive mechanism 26, toolhead assemblies 28, work transfer mechanism 30, retract mechanism 36, and drive coupling mechanism 38, in that order, under the respective headings. The operational description of the complete apparatus 10 will follow the detailed discussion of the listed components.

FRAMEWORK

Figure 1:
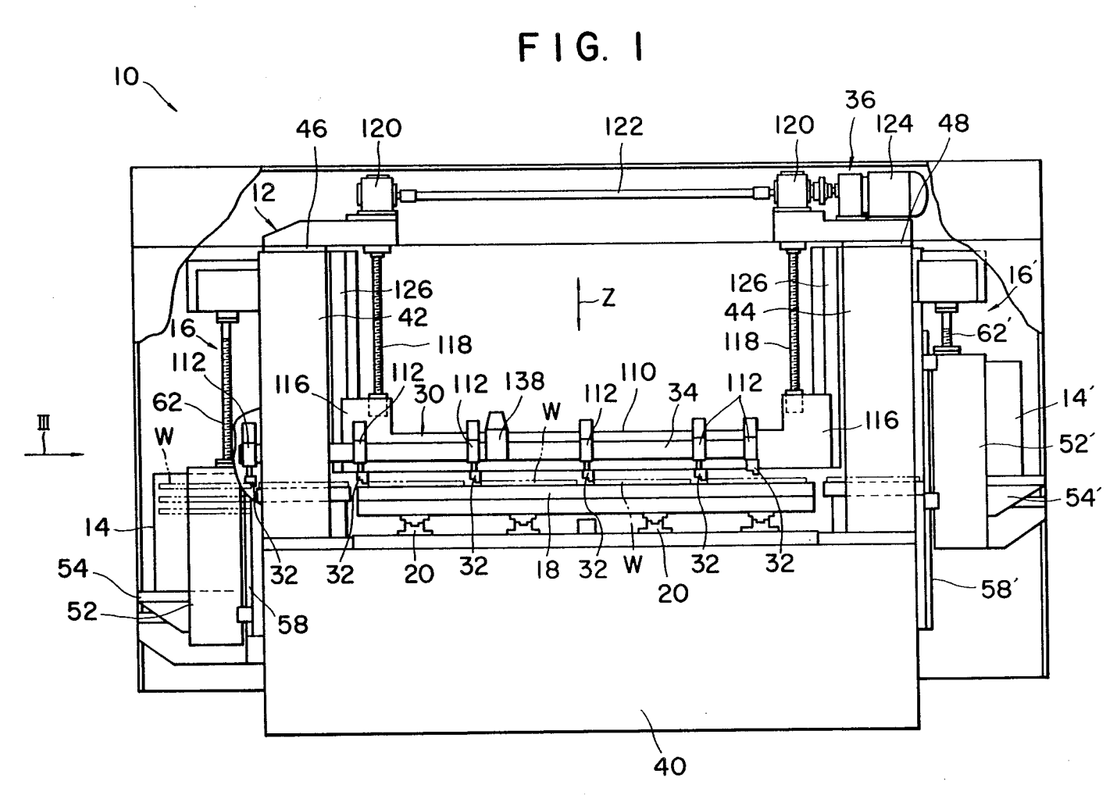
FIG. 1 is a front elevation of the PCB drilling machine embodying the principles of our invention, with parts shown broken away to reveal other parts.

As shown also in FIGS. 1 and 2, the framework 12 includes a bed 40 having the table guide rails 20 rigidly mounted thereon. Erected from the bed 40 are two opposed pairs of columns 42 and 44. The left hand pair, as seen in FIGS. 1 and 2, of columns 42 have their tops joined by a horizontal beam 46. The right hand pair of columns 44 also has their tops joined by a horizontal beam 48.

MAGAZINES AND MAGAZINE DRIVE MECHANISMS

The supply magazine 14 is for holding in neat stack a supply of PCBs W to be drilled, for delivery onto the table 18 by the work transfer mechanism 30. The recovery magazine 14 is for receiving and stacking the drilled PCBs from the table 18 via the work transfer mechanism 30. The two magazines 14 and 14', as well as their drive mechanisms 16 and 16', are both of like construction. We will therefore describe only the supply magazine 14 in conjunction with its drive mechanism 16, with the understanding that the same description essentially applies to the recovery magazine 14' and its drive mechanism 16'. We will identify the various parts of the recovery magazine 14' and its drive mechanism 16' merely by priming the reference numerals used to denote the corresponding parts of the supply magazine 14 and its drive mechanism 16.

Figure 3:
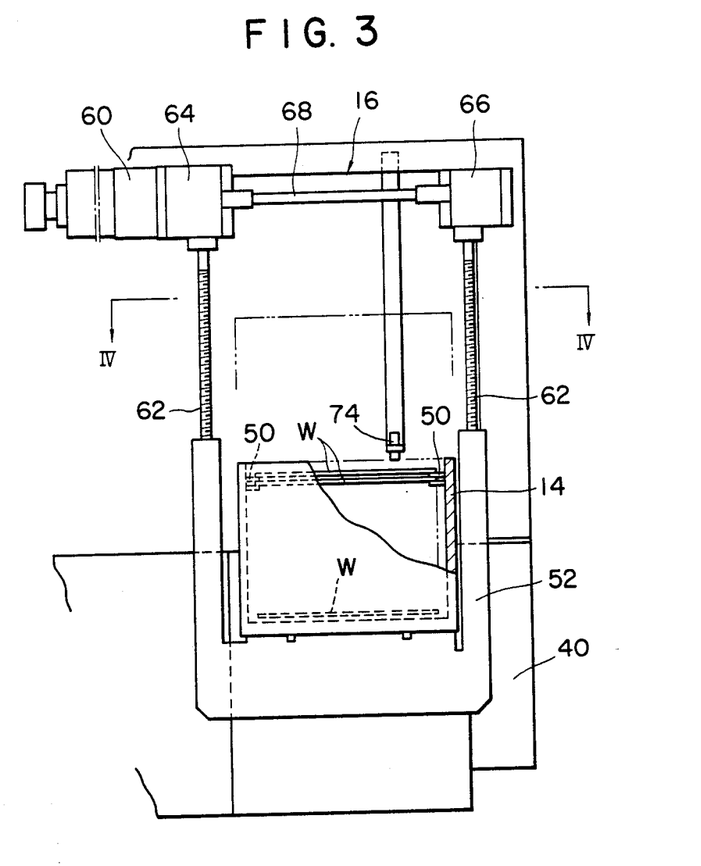
FIG. 3 is an enlarged side elevation of the PCB drilling machine as seen in the direction of the arrow III in FIG. 1, the view showing in particular the work supply magazine and its drive mechanism.
Figure 4:
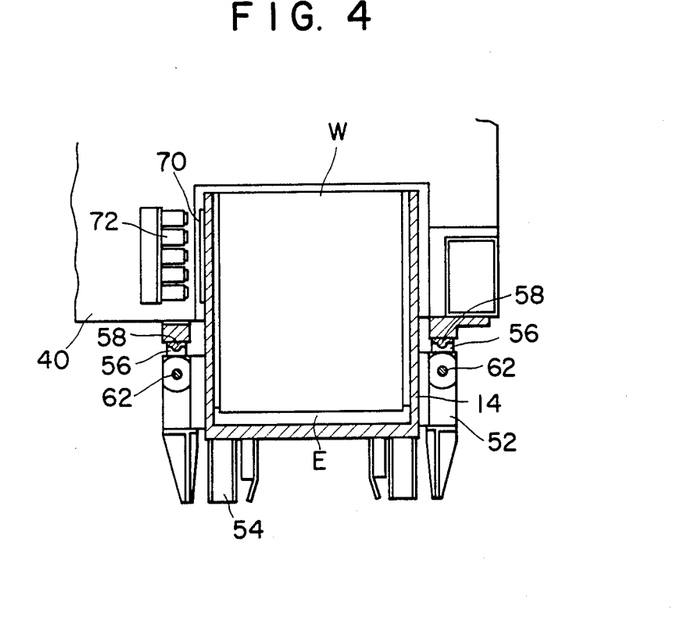
FIG. 4 is a horizontal section through the work supply magazine and associated means, taken along the line IV—IV of FIG. 3.

As illustrated in FIGS. 3 and 4, the supply magazine 14 is in the form of a box, opening both upwardly and toward the table 18. The magazine is internally provided with pairs of vertically spaced apart ledges 50 protruding toward each other from its front and rear sides. Each opposed pair of ledges 50 holds one PCB W thereon, so that a plurality or multiplicity of PCBs can be held in neat stack within the magazine 14.

The supply magazine 14 must be lifted a unit distance (equal to the pitch distance between the pairs of ledges 50) each time one PCB to be machined is transferred therefrom onto the table 18. (The recovery magazine 14' must be lowered the same unit distance each time on machined PCB is transfered thereto from the table 18.) Toward this end the supply magazine 14 is removably mounted on a magazine cradle 52, approximately in the shape of a U as seen endwise as in FIG. 3, which is movable up and down relative to the framework 12 and which is coupled to the magazine drive mechanism 16. The magazine cradle 52 has its bottom formed by a pair of horizontal magazine guides 54 to expedite the loading and unloading of the magazine 14. The magazine cradle 52 has grooved shoes 56 rigidly attached thereto for sliding engagement with a pair of vertical guide ridges 58 on the framework 12.

As best seen in FIG. 3, the magazine drive mechanism 16 includes an electric magazine drive motor 60 coupled to a pair of upstanding lead screws 62 via respective gear assemblies 64 and 66. A shaft 68 links the two gear assemblies 64 and 66 for motor torque transmission to the gear assembly 66 remote from the magazine drive motor 60. Depending from the respective gear assemblies 64 and 66, the pair of lead screws 62 make threaded engagement with the magazine cradle 52. Accordingly, the magazine cradle 52 with the supply magazine 14 thereon is vertically displaceable in response to the rotation of the magazine drive motor 60.

Perhaps an incidental feature of our invention, the supply magazine 14 bears on its outside an optically discernible mark 70, FIG. 4, such as a reflective surface portion which by its location on the magazine indicates the particular kind of PCBs contained therein. A set of mark sensors 72 of any known or suitable design, such as photodetectors, are fixedly mounted to the bed 40 for sensing the location of the mark 70 on the supply magazine 14 and for ascertaining the kind of PCBs contained therein from the mark location. An additional sensor 74, FIG. 3, is disposed over the supply magazine 14 for the determination of the presence or absence of the PCBs in the magazine. All those sensors 72 and 74 are electrically connected to the automatic control system, not shown, of this PCB drilling machine 10.

TABLE

Figure 5:
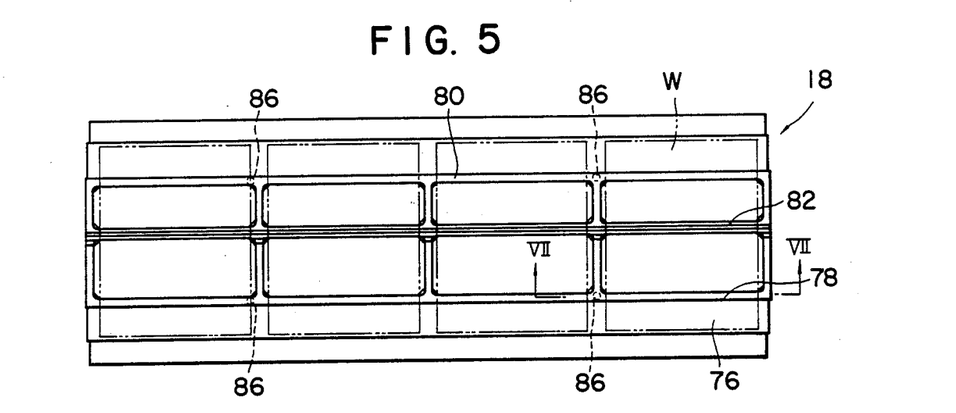
FIG. 5 is an enlarged top plan of the table, as well as of the work lift means provided thereto, of the PCB drilling machine of FIG. 1.
Figure 6:
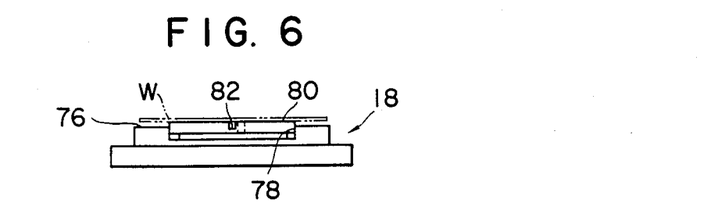
FIG. 6 is an end elevation of the table of FIG. 5.
Figure 7:
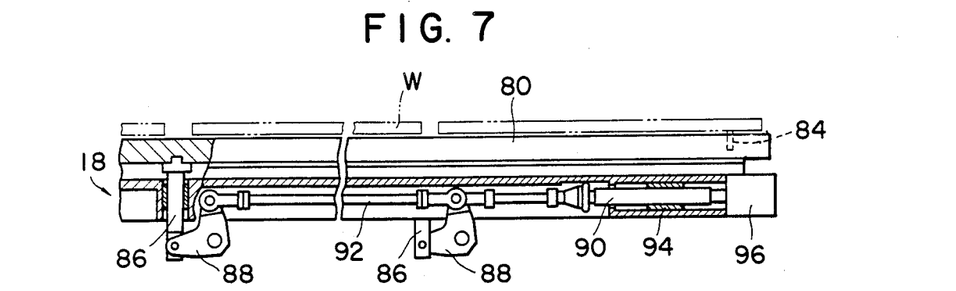
FIG. 7 is an enlarged, fragmentary vertical section through the table of FIG. 5, taken along the line VII—VII therein.

We have illustrated the table 18 in greater detail in FIGS. 5, 6 and 7. The table 18 has a top surface 76 on which the work is to be placed during machining. A depression 78 is formed longitudinally (i.e. in the direction of the arrow Y in FIG. 2) in the table top surface 76. The width of this depression 78 is such that the table top surface 76 is left on both front and rear sides of the depression. Received in the depression 78 is a lifting platform 80 of latticed or otherwise open worked construction. The lifting platform 80 is movable up and down with respect to the table 18 between a retracted position, where the platform is buried on the table to allow the PCBs W to rest directly on the table top surface 76, and a working position of FIG. 6 where the platform rises above the plane of the table top surface for permitting the PCBs to slide thereover. The lifting platform 80 is to be held in the working position during the transfer of the work and is to be retracted during the machining of the work.

As shown in both FIGS. 5 and 6, a guide groove 82 is defined in the top surface of the lifting platform 80, extending longitudinally thereof and located approximately centrally with respect to its transverse dimension. We assume that each PCB W has a depending pin 84, FIG. 7, for sliding engagement in the guide groove 82, in order that the work may be transferred exactly along the predetermined path over the lifting platform 80 and, in consequence, over the table 18.

The table 18 is further provided with means for moving the lifting platform 80 between the retracted and working positions. As shown in FIG. 7, such means include a plurality of lift pins 86 fixed to the underside of the lifting platform 80 and each depending therefrom into pivotal connection with one of the arms of a bell crank 88. The other arm of each bell crank 88 is operatively coupled to a piston 90 via a drive linkage 92. The piston 90 is supported by a sleeve bearing 94 on the table 18 for reciprocating motion in a direction normal to the axes of the bell cranks 88. Also mounted to the table 18, a fluid actuated cylinder 96 is coupled to the piston 90 for reciprocably driving the same. We will refer to this cylinder as the platform cylinder by way of contradistinction from other fluid actuated cylinders to be set forth presently.

The platform cylinder 96 may be extended for holding the lifting platform 80 in the retracted position. Upon contraction of the platform cylinder 96, then, the bell cranks 88 will pivot clockwise, as viewed in FIG. 7, for elevating the platform 80 to the working position of FIG. 6 via the lift pins 86.

SADDLES AND SADDLE DRIVE MECHANISM

We have shown the saddles 22 in FIG. 2 but not in FIG. 1 for the better illustration of the work transfer mechanism 30 in the latter figure. The two saddles 22 are rigidly interconnected by a link 98 shown also in FIGS. 8 and 9. The saddle drive mechanism 26 includes a reversible saddle drive motor 100, FIG. 2, drivingly coupled to a lead screw 102, FIG. 9, which is in threaded engagement with nuts or ball nuts 104 on the backs of the saddles 22 and saddle link 98. Thus the saddles 22 travel back and forth along the crossrail 24 with the bidirectional rotation of the saddle drive motor 100.

TOOLHEAD ASSEMBLIES

Each saddle 22 has mounted thereto one or more, two in the illustrated embodiment, toolhead assemblies 28 as in FIG. 2. Each toolhead assembly 28 may be of conventional design comprising a spindle directed downwardly, to which a drill D, FIG. 9, or like cutting tool may be removably attached. The drills D on the four illustrated toolhead assemblies 28 may be either alike or unlike in diameter. An electric motor 106, preferably a servomotor, is also mounted to each saddle 22 for driving the associated toolhead assemblies 28.

WORK TRANSFER MECHANISM

Figure 9:
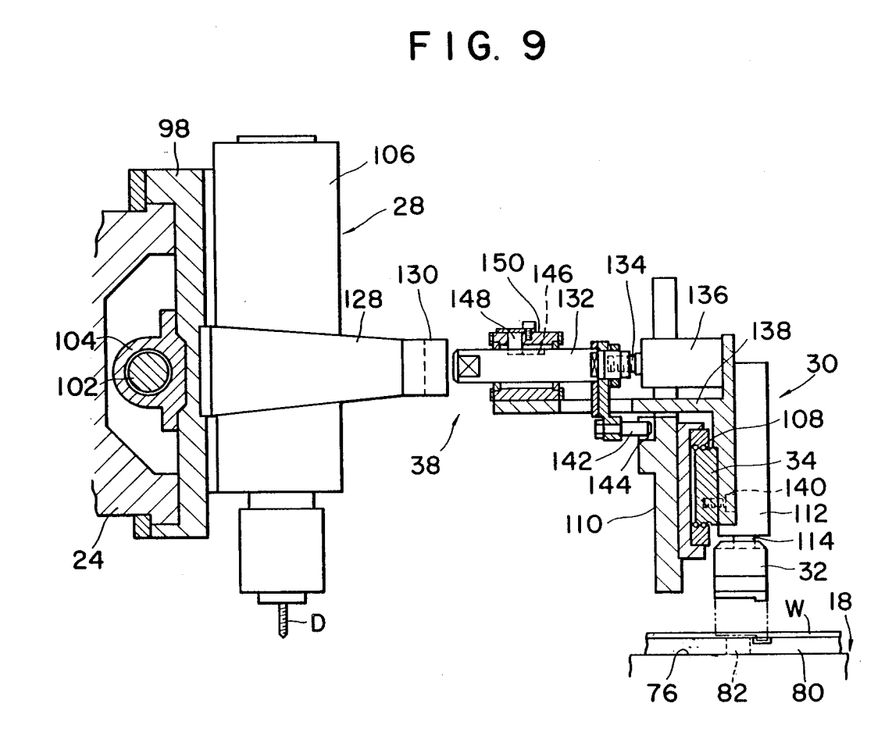
FIG. 9 is a vertical section through the drive coupling mechanism of FIG. 8, taken along the line IV—IV therein.

The work transfer mechanism 30 will be understood from a study of FIGS. 1, 2 and 9. Closely associated with the work transfer mechanism 30, or constituting a part thereof, is the noted carriage 34 horizontally elongated in the Y direction. FIG. 9 reveals that the carriage 34 is mounted via balls 108 to a guide beam 110 supported horizontally over the table 18 and extending parallel to the crossrail 24. The carriage 34 rolls along the guide beam 110 in its longitudinal direction.

Mounted to the carriage 34 are a plurality of, six in the illustrated embodiment, fluid actuated cylinders 112, preferably pneumatic, which are spaced from one another in the longitudinal direction of the carriage, as shown in both FIGS. 1 and 2. Each cylinder 112 has a piston rod 114, FIG. 9, directed downwardly therefrom and coupled fast to one of the aforesaid work transfer fingers 32. Driven by the respective cylinders 112, the work transfer fingers 32 are movable up and down with respect to the carriage 110 into and out of work transfer engagement with the trailing edges of the PCBs W within the supply magazine 14 and on the table 18. We will refer to the cylinders 112 as the finger drive cylinders hereafter.

RETRACT MECHANISM

We will refer to FIGS. 1 and 2 for the discussion of the retract mechanism 36 associated with the work transfer mechanism 30. As better shown in FIG. 1, the carriage 110 has a pair of enlargements 116 at its opposite ends. These enlarged ends of the carriage 110 are threadedly engaged respectively with a pair of upstanding lead screws 118 depending from the horizontal beams 46 and 48 of the framework 12. The lead screws 118 have their top ends coupled respectively to a pair of gear assemblies 120 having a shaft 122 extending therebetween to be driven by a common reversible retract motor 124 on the horizontal beam 48.

Therefore, with the bidirectional rotation of the retract motor 124, the carriage 110 together with the work transfer fingers 32, finger drive cylinders 112, etc., mounted thereto, travels up and down with respect to the framework 112. We have shown in FIG. 1 the carriage 110 lowered to its working position, where the work transfer fingers 32 are movable into and out of work transfer engagement with the work. The columns 42 and 44 are provided with guides 126 for relative sliding or rolling engagement with the enlarged ends 115 of the carriage 110.

DRIVE COUPLING MECHANISM

Figure 8:
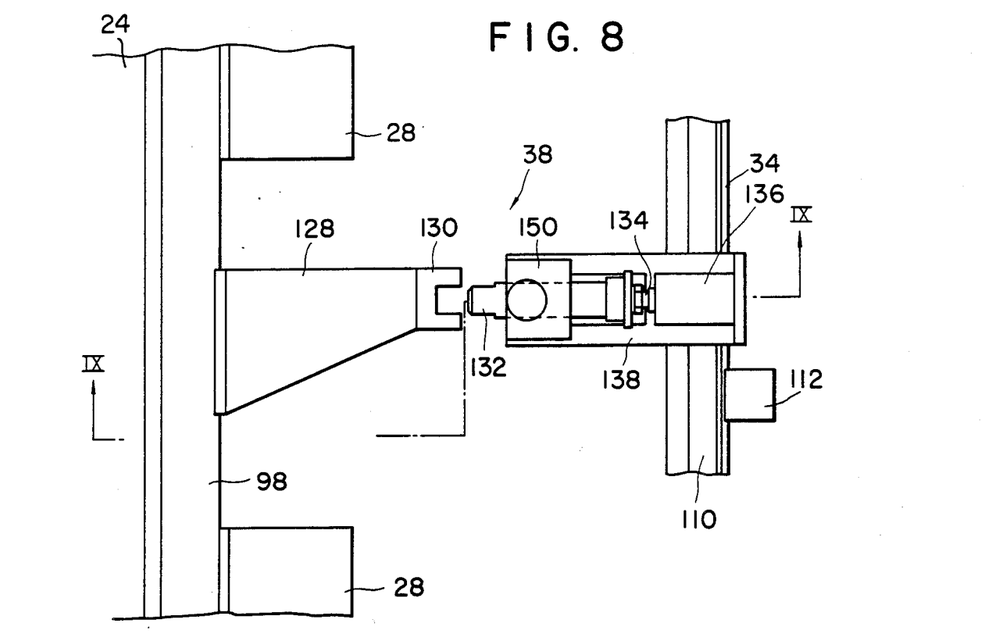
FIG. 8 is an enlarged top plan of the drive coupling mechanism included in the PCB drilling machine of FIG. 1, the drive coupling mechanism being shown enclosed in the dashed circle designated VIII in FIG. 2.

The drive coupling mechanism 38, shown in FIG. 2 and in further detail in FIGS. 8 and 9, makes it possible for the work transfer mechanism 30 to be driven by the saddle drive motor 100. Included is a cantilever support 128 extending forwardly from the saddle lnk 98 to rigidly support a socket or female member 130. A male member 132, mounted to the carriage 34 in a manner hereinafter set forth, is movable into and out of positive engagement with the female member 130. The male member 132 is coupled to the piston rod 134 of a fluid actuated cylinder 136, preferably pneumatic, mounted fast on a support structure 138 fastened as at 140, FIG. 9, to the carriage 34. We will call this cylinder 136 the drive coupling cylinder. The extension and contraction of the drive cylinder 136 results in the movement of the male member 132 into and out of engagement with the female member 130, provided, of course, that the horizontal positions of the male and female members are in register.

Preferably, and as shown in FIG. 9, the male member 132 has a stop 142 depending therefrom to butt on an abutment 144 on the guide beam 110 upon full retraction of the male member. The male member 132 is further provided with a longitudinal guide groove 146 in which there is slidably engaged a guide pin 148 affixed to a hollow member 150 rigidly mounted to the support structure 138 to slidably support the male member. The length of the guide groove 146 is so determined as to limit the stroke of the male member 132.

OPERATION

PCBs W to be drilled by the machine 10 may first be stacked in the supply magazine 14. We recommend that the supply magazine 14 be removed from the magazine cradle 52 for such loading of the PCBs, as the loading operation will be easier. The loaded supply magazine 14 may be slid over the pair of guides 54 into position on the magazine cradle 52. Thereupon the mark sensors 72, FIG. 4, will sense the location of the work identification mark 70 on the supply magazine 14 and will cause the unshown control circuitry to control the operation of the apparatus 10 in accordance with the program that has been prepared for the particular kind of PCBs contained in the magazine. The recovery magazine 14', initially empty, is similarly mounted in position on the cradle 52'.

The supply magazine drive mechanism 16, FIG. 3, may be operated by setting the magazine drive motor 60 into rotation in a direction for lowering the supply magazine 14 together with the cradle 52, until the supply magazine comes to the lowermost position as in FIG. 1. The recovery magazine drive mechanism 16' may also be operated for raising the recovery magazine 14' to the highest position, also as depicted in FIG. 1.

We understand that the work transfer mechanism 30 has been lowered to its working position of FIG. 1 by the retract mechanism 36. With the work transfer mechanism 30 held in this working position, its transfer fingers 34 when lowered by the finger drive cylinders 112 will be on a level with the uppermost PCB within the supply magazine 14 being held in its lowermost position, and with the lowermost PCB storage position within the recovery magazine 14' being held in its highest position.

The platform cylinder 96, FIG. 7, may be contracted to cause the upward displacement of the lifting platform 80 to the working position of FIG. 6.

It is also necessary, preparatory to the commencement of drilling operation, that the work transfer mechanism 30 be coupled to the saddle drive mechanism 26, FIG. 2, via the drive coupling mechanism 38. Since the work transfer mechanism 30 has been lowered by the retract mechanism 36 as we assumed above, the male member 132 of the drive coupling mechanism 38 is now on the same horizontal plane with the female member 130. However, the male and female members 132 and 130 may not be in vertical alignment with each other. The saddle drive motor 100 may therefore be set into rotation in either direction until the female member 130 comes into vertical alignment with the male member 132 as in FIG. 8. Then the drive coupling cylinder 136 may be extended to move the male member 132 into positive engagement with the female member 130. The work transfer mechanism 30, or its carriage 34, has now been linked to the saddle drive motor 100 to be driven thereby.

We have thus made the machine 10 ready for drilling operation. Work transfer may now be commenced by setting the saddle drive motor 100 into rotation in the direction to cause leftward displacement, as viewed in FIGS. 1 and 2, of the work transfer mechanism 30 together with the saddles 22 and the means mounted thereto. The rotation of the saddle drive motor 100 may be suspended when the leftmost one of the work transfer fingers 34 reaches a position over the farthest (trailing) edge E, FIG. 4, of the uppermost PCB W within the supply magazine 14. Then at least the associated finger drive cylinder 112 may be extended to lower the leftmost work transfer finger 32 into work transfer engagement with the edge E of the uppermost PCB.

Then the saddle drive motor 100 may again be set into rotation, this time in a direction to cause the rightward displacement of the work transfer mechanism 30 together with the saddles 22 and so forth. Pushed by the leftmost work transfer finger 32, the uppermost PCB will travel from the supply magazine 14 onto the raised platform 80 of the table 18, with the depending pin 84 of the work becoming engaged in the guide groove 82 in the platform thereby to be guided in the required direction.

The saddle drive motor 100 may be set out of rotation when the work transfer mechanism 30 travels a stroke determined by the size of each PCB contained in the supply magazine 14. Then the leftmost work transfer finger 32 may be raised out of engagement with the first PCB, leaving the same in a first preassigned drilling position on the table 18. Then the leftmost work transfer finger 32, together with all the other work transfer fingers, may be returned toward the supply magazine 14. Perhaps immediately after the the loading of the first PCB on the table 18, the supply magazine 14 has been raised the predetermined unit distance by the magazine drive mechanism 16. Therefore, when lowered subsequently, the leftmost work transfer finger 32 will come into work transfer engagement with the second PCB within the supply magazine 14. Then this second PCB may likewise be transferred away from the supply magazine 14 to the first drilling position on the table 18, while at the same time the first PCB is transferred from the first to a second drilling position thereon.

The above loading cycle may be repeated until, in this particular embodiment, four PCBs are placed side by side in the four preassigned drilling positions on the table 18. The horizontal and vertical displacements of the work transfer fingers 32, caused respectively by the saddle drive motor 100 and the finger drive cylinders 112, are controlled as aforesaid by the program dictated for each particular kind of PCBs to be handled by this machine 10. The number of work transfer fingers 32 that must be used for such work transfer is subject to change depending upon the size of the PCBs to be drilled. We suggest, therefore, that the spacings between these work transfer fingers 32, as well as the finger drive cylinders 112, on the carraige 34 be made variable to suit each different size of PCBs.

It may be noted that the lifting platform 80 remains raised to the FIGS. 6 and 9 position throughout the above loading operation of the four PCBs. Sliding over this open worked platform 80, the PCBs will receive far less frictional resistance than if they travelled directly over the solid table surface 76. There is also absolutely no possibility of the table surface 76 being scratched by the PCBs.

Upon completion of the loading of the set of four PCBs, the table cylinder 96 may be extended to cause the descent of the lifting platform 80 to the retracted position below the level of the table surface 76. The loaded four PCBs will then rest on the surface 76 of the table 18.

Also, upon completion of the loading, the drive coupling cylinder 136, FIGS. 8 and 9, of the drive coupling mechanism 38 may be contracted to withdraw the male member 132 out of engagement with the female member 130. Thus disconnected from the work transfer mechanism 30, the saddle drive motor 100 is now conditioned to drive only the four toolhead assemblies 28 via the saddles 22.

The drilling of the four PCBs on the table 18 may now be commenced. The drills D, FIG. 9, of the toolhead assemblies 28 can be moved to any position on the PCBs as the table 18 is displaced in the X direction, FIG. 2, by the unshown table drive mechanism and as the toolhead assemblies are displaced in the Y direction by the saddle drive mechanism 26. The drills D may be driven by the servomotors 106 for creating holes in the PCBs in any required positions.

Upon completion of the drilling, the set of drilled PCBs must be unloaded from the table 18 into the recovery magazine 14', and another set of four PCBs loaded on the table from the supply magazine 14. The lifting platform 80 may be raised to the working position of FIGS. 6 and 9, thereby lifting the four drilled PCBs out of contact with the table surface 76, preparatory to such unloading and loading operations. It is also necessary to reconnect the work transfer mechanism 30 to the saddle drive motor 100 by the drive coupling mechanism 38. This saddle drive motor 100 may first be rotated in a direction required to move the female member 130 on the saddle link 98 into alignment with the male member 132. Then the drive coupling cylinder 136 may be extended to thrust the male member 132 into engagement with the female member 130.

Then the carriage 34 of the work transfer mechanism 30 may be moved in the Y direction by the saddle drive motor 100 until four of the work transfer fingers 32 come to positions of vertical register with the trailing edges E of the four drilled PCBs on the lifting platform 80. Then the finger drive cylinders 112 may be extended to lower the work transfer fingers into work transfer engagement with the four PCBs. Then the saddle drive motor 100 may be reactivated to cause the rightward displacement, as seen in FIGS. 1 and 2, of the work transfer mechanism 30 with the four drilled PCBs until the extreme righthand PCB enters the recovery magazine 14' being held in its uppermost position. Upon recovery of the first drilled PCB the recovery magazine 14' may be lowered with its cradle 52' the predetermined unit distance by the magazine drive mechanism 16'.

The foregoing unloading cycle is repeated until the four drilled PCBs are all unloaded from the table 18 and stacked within the recovery magazine 14'. As will be understood, a new set of four PCBs are loaded one after another on the table 18, through the above described procedure, concurrently with the unloading of the drilled PCBs therefrom.

Such concurrent loading and unloading, and drilling, of the PCBs may be repeated until all the PCBs that have been contained in the supply magazine 14 are drilled and recovered in the recovery magazine 14'. Then the recovery magazine 14' holding the stack of drilled PCBs may be withdrawn from its cradle 52' and transported to a required location for further processing. The supply magazine 14, now empty, may also be withdrawn from its cradle 52. Drilling operation can be restarted as a supply magazine containing a new stack of PCBs and an empty recovery magazine are slid into the respective cradles 52 and 52'.

The need will arise in the use of this machine 10 for changing its cutting tools. Then the reversible motor 124, FIGS. 1 and 2, of the retract mechanism 36 may be set into rotation in a direction for causing the ascent of the complete work transfer mechanism 30, including the guide beam 110, to its retracted position. We intend by this retraction of the work transfer mechanism 30 to provide forwardly open space for the easier change of the cutting tools. The work transfer mechanism 30 may be similarly retracted for repair or maintenance purposes.

Although we have shown and described our invention in terms of but one embodiment thereof and as adapted for the drilling of PCBs, we recognize, of course, that our invention could be embodied in other forms and adapted for other purposes within the broad teaching hereof. The illustrated details of construction are therefore by way of example only and not to impose limitations upon our invention. For instance, in the drive coupling mechanism shown in FIGS. 8 and 9, the female member 130 could be mounted to the carriage 34, and the male member 132 to the saddle link 98. It will also be apparent that not the male member 132 but the female member 130 could be coupled to the drive coupling cylinder 136 or to an equivalent actuator, all that is required being that the two members be relatively movable into and out of engagement with each other.

We claim:

1. A machine tool for working on flat workpieces such as printed circuit boards, comprising:
   (a) frame means;
   (b) a work supply magazine mounted to the frame means on one side thereof for holding a stack of flat workpieces to be worked upon;
   (c) a work recovery magazine mounted to the frame means on the other side thereof for receiving the workpieces that have been worked upon;
   (d) a table mounted to the frame means intermediate the work supply magazine and the work recovery magazine;
   (e) saddle means mounted to the frame means and constrained to linear travel relative to the same along a predetermined path extending between the work supply magazine and the work recovery magazine;
   (f) saddle drive means for controllably moving the saddle means along the predetermined path;
   (g) toolhead means mounted to the saddle means and disposed over the table for working on the workpieces on the table;
   (h) a carriage disposed over the table and constrained to linear travel relative to the frame means in a direction parallel to the predetermined path of the saddle means;
   (i) work transfer means mounted to the carriage for vertical displacement into and out of work transfer engagement with the workpieces in the work supply magazine and on the table; and
   (j) drive coupling means for connecting and disconnecting the saddle means and the carriage, the carriage when connected to the saddle means being driven by the saddle drive means for enabling the work transfer means to transfer the successive workpieces from the work supply magazine to the table and thence, upon completion of the required working on the workpieces by the toolhead means, to the work recovery magazine, the carriage when disconnected from the saddle means allowing the toolhead means to work on the workpieces on the table by being driven by the saddle drive means independently of the carriage and the work transfer means.

2. The machine tool of claim 1 further comprising:
   (a) first magazine drive means for lifting the work supply magazine a predetermined unit distance each time one workpiece is transferred therefrom onto the table; and
   (b) second magazine drive means for lowering the work recovery magazine a predetermined unit distance each time one workpiece is transferred thereto from the table.

3. The machine tool of claim 1 wherein the work supply magazine and the work recovery magazine are each in the form of a box opening both upwardly and toward the table.

4. The machine tool of claim 1 wherein the work supply magazine and the work recovery magazine are both readily detachable from the frame means.

5. The machine tool of claim 1 wherein the table is reciprocably movable relative to the frame means in a direction at right angles with the predetermined path of the saddle means.

6. The machine tool of claim 1 further comprising work lift means provided to the table for holding the workpieces above the table during their transfer from the work supply magazine to the table and from the table to the work recovery magazine.

7. The machine tool of claim 6 wherein the work lift means comprises:
   (a) a lifting platform mounted to the table for up and down displacement between a retracted position, where the lifting platform is buried in the table to allow the workpieces to rest directly on the table, and a working position where the lifting platform is raised above the table for holding the workpieces thereon; and
   (b) means for moving the lifting platform between the retracted and working positions.

8. The machine tool of claim 7 wherein the lifting platform of the work lift means is open worked.

9. The machine tool of claim 1 wherein the saddle means comprises:
   (a) a guide rail extending along the predetermined path; and
   (b) a plurality of saddles mounted to the guide rail for reciprocating movement along the same, the saddles being interconnected for joint travel along the guide rail.

10. The machine tool of claim 9 wherein the saddle drive means comprises a lead screw extending parallel to the guide rail and threadedly engaged with the saddles.

11. The machine tool of claim 9 wherein the toolhead means comprises:
    (a) at least one toolhead mounted to each saddle; and
    (b) tool drive means mounted to each saddle and coupled to the associated toolhead.

12. The machine tool of claim 1 wherein the carriage is elongated in the direction of its travel, and wherein the work transfer means comprises:
    (a) a plurality of work transfer fingers mounted to the carriage with spacings therebetween in the longitudinal direction of the carriage; and
    (b) finger drive means on the carriage for reciprocably moving the work transfer fingers in a vertical direction relative to the carriage.

13. The machine tool of claim 12 wherein the finger drive means comprises a plurality of fluid actuated cylinders mounted to the carriage and coupled one to each work transfer finger.

14. The machine tool of claim 1 further comprising means on the frame means for jointly moving the carriage and the work transfer means between a working position, where the work transfer means is movable into and out of work transfer engagement with the workpieces in the work supply magazine and on the table, and a retracted position away from the table.

15. The machine tool of claim 1 wherein the drive coupling means comprises:

(a) a male member coupled to either of the saddle means and the carriage;
(b) a female member coupled to the other of the saddle means and the carriage and directed toward the male member; and
(c) means for moving either of the male and female members into and out of positive engagement with each other.

* * * * *